US011329648B2

(12) United States Patent
Ueda

(10) Patent No.: US 11,329,648 B2
(45) Date of Patent: May 10, 2022

(54) CURRENT SOURCE CIRCUIT

(71) Applicant: Yuichi Ueda, Ebina (JP)

(72) Inventor: Yuichi Ueda, Ebina (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/180,300

(22) Filed: Feb. 19, 2021

(65) Prior Publication Data
US 2021/0305979 A1 Sep. 30, 2021

(30) Foreign Application Priority Data

Mar. 24, 2020 (JP) .............................. JP2020-052901

(51) Int. Cl.
H03K 5/24 (2006.01)
H03K 17/687 (2006.01)
H03K 19/20 (2006.01)
G05F 1/10 (2006.01)
H03K 5/00 (2006.01)

(52) U.S. Cl.
CPC ......... H03K 17/6871 (2013.01); H03K 19/20 (2013.01); H03K 2005/00013 (2013.01)

(58) Field of Classification Search
None
See application file for complete search history.

(56) References Cited

U.S. PATENT DOCUMENTS

| 4,868,416 | A | * | 9/1989 | Fitzpatrick | ................ G05F 3/24 327/541 |
| 7,838,809 | B2 | * | 11/2010 | Ludwig | ............... H01L 29/1606 250/214 A |
| 8,085,078 | B2 | * | 12/2011 | Honda | ............ H03K 19/00384 327/333 |
| 8,179,099 | B2 | * | 5/2012 | Tange | ................... H02J 7/0026 320/134 |
| 8,248,176 | B2 | | 8/2012 | Takano et al. | |
| 9,806,720 | B1 | * | 10/2017 | Cavus | ................ H03K 19/0948 |
| 10,190,918 | B2 | * | 1/2019 | Higuchi | ............ G01C 19/5776 |
| 10,461,693 | B2 | * | 10/2019 | Fukuzawa | ............... H03L 1/023 |
| 10,747,248 | B2 | * | 8/2020 | Okeya | ...................... G05F 3/262 |
| 10,778,111 | B1 | * | 9/2020 | Godycki | ................. G05F 3/247 |
| 10,791,601 | B2 | * | 9/2020 | Chang | .................... H05B 45/22 |
| 10,886,838 | B2 | | 1/2021 | Terada et al. | |

(Continued)

FOREIGN PATENT DOCUMENTS

JP H05235661 A 9/1993
JP 2003051740 A 2/2003
(Continued)

Primary Examiner — Kenneth B Wells
(74) Attorney, Agent, or Firm — Holtz, Holtz & Volek PC

(57) ABSTRACT

A discharge control circuit includes discharge elements, logic circuits, and at least one delay circuit. Each of the logic circuits controls turning-on and turning-off the discharge elements based on a control signal inputted externally. The delay circuit delays an output signal of a first logic circuit among the logic circuits. The discharge control circuit pulls out charges from a corresponding terminal in response to turning-on of the discharge elements. A signal delayed by the delay circuit is inputted to a second logic circuit among the logic circuits so that the discharge elements are controlled in a predetermined order by one control signal.

20 Claims, 11 Drawing Sheets

(56) References Cited

U.S. PATENT DOCUMENTS

| | | | |
|---|---|---|---|
| 10,886,846 B2 * | 1/2021 | Liu | H02M 1/36 |
| 2016/0025792 A1 * | 1/2016 | Oestreicher | G01R 31/50 |
| | | | 324/538 |

FOREIGN PATENT DOCUMENTS

| | | |
|---|---|---|
| JP | 2011150675 A | 8/2011 |
| JP | 2020003913 A | 1/2020 |

\* cited by examiner

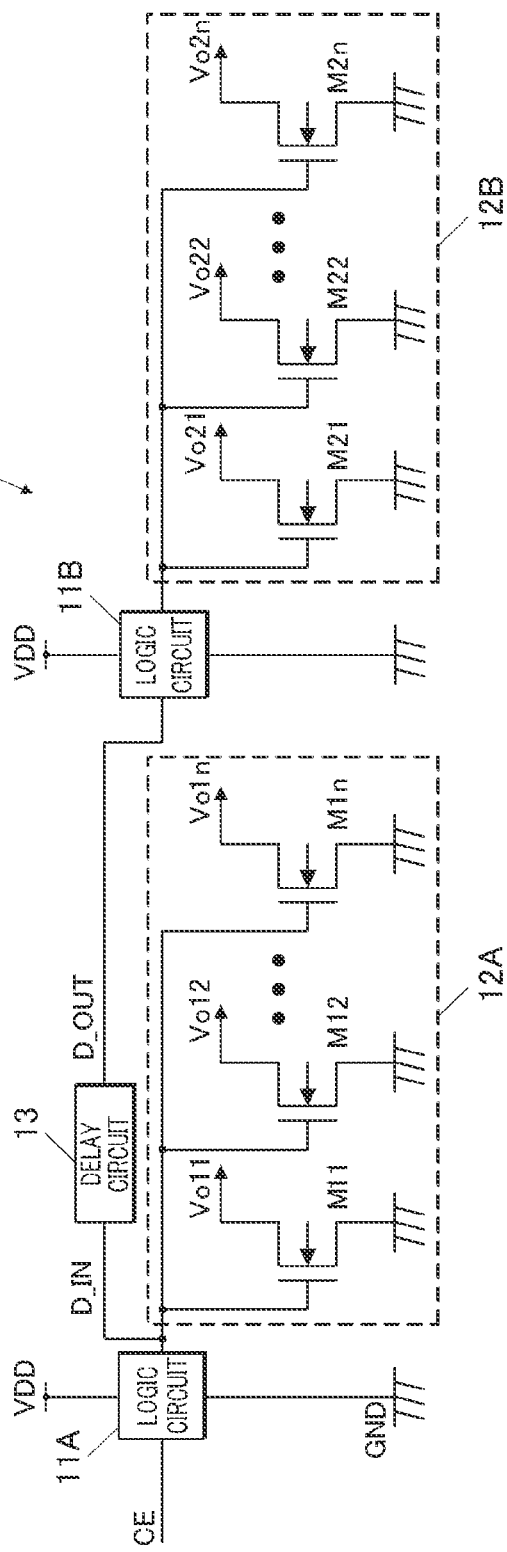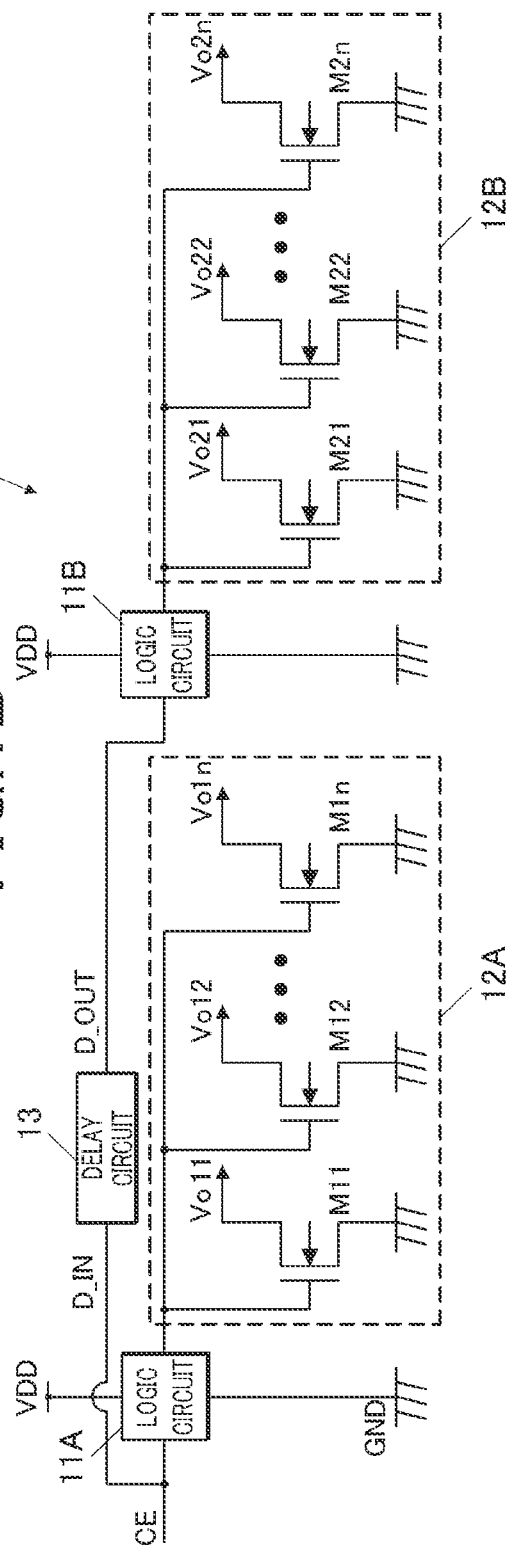

Prior Art

CURRENT SOURCE CIRCUIT

CROSS REFERENCE TO RELATED APPLICATION

This application is based upon and claims the benefit of priority under 35 USC 119 of Japanese Patent Application No. 2020-052901 filed on Mar. 24, 2020, the entire disclosure of which, including the description, claims, drawings and abstract, is incorporated herein by reference in its entirety.

BACKGROUND OF THE INVENTION

1. Field of the Invention

The present invention relates to a discharge control circuit having elements for discharge and a current source circuit.

2. Description of Related Art

Some of the devices that require multiple power supplies, such as a CPU (microprocessor), a SoC (system-on-chip) and a system LSI, have a predetermined sequence (order) of turning-on and turning-off. For example, in a CPU using two power supplies (regulator) for I/O and a core, a potential of an I/O power supply is generally higher than a potential of a core power supply. In such a device or system, if relation between potentials of the power supplies for I/O and core is reversed, parasitic elements which is the core inside the CPU is sometimes turned on to cause breakdown. Therefore, in a device using multiple power supplies, constraints need to be applied on a power-on sequence and a power-off sequence. The power-on sequence is easily controlled because a rise time depends on performance of a power supply IC. On the other hand, it is difficult to control the power-off sequence because a discharge time depends on a load capacity and a load resistance of a power supply IC.

Conventionally, in a device or a system like the above, in order to control the power-off sequence, discrete components (inverter, FET, resistance, etc.) have been constituting a discharge circuit.

To stop supply of power (turn off a regulator), two control signals make the core power supply discharge first, and then make the I/O power supply discharge.

On the other hand, inventions relating to semiconductor integrated circuits for discharge, such as the one disclosed in JP2020-3913A, have been proposed. According to those inventions, the semiconductor integrated circuit controls a power-off sequence of power supplies or supplied voltages by one control signal, and easily changes a discharge time.

A delay circuit that defines a delay time is required for controlling the power-on sequence and the power-off sequence.

Such delay circuit can be constituted by:

combination of a constant current source, a capacitor, and a switch element; or combination of an oscillator (clock generation circuit) and a counter circuit.

Inventions of a power control semiconductor integrated circuit, such as the one in JP2003-51740A, are provided with a delay circuit that defines a delay time for controlling the power-on sequence and the power-off sequence.

In a power control semiconductor integrated circuit disclosed in JP2003-51740A, a capacitance constituting a delay circuit is included in the circuit, and a delay time is determined at the time of manufacturing a semiconductor. A current ratio of a current source constituting the delay circuit is also determined at the time of manufacturing a semiconductor, and is fixed. Therefore, a ratio of a first delay time to a second delay time is fixed, the first delay time being a time length between a time when control input changes and a time when one output signal changes, and the second delay time being a time length between the time when control input changes and a time when another output signal changes. It brings a problem that control sequences for power-on and power-off cannot be freely set. A current value of a current source circuit in the circuit disclosed in JP2003-51740A changes as a power voltage changes. It brings a problem that the delay time depends on a power voltage.

In a case in which a constant current source is included in a semiconductor integrated circuit, it is desired that the circuit compensates for change in temperature so that ambient temperature does not affect a current. Inventions relating to a current source circuit that compensates for change in temperature are disclosed in, for example, JPH05-235661A and JP2011-150675A.

SUMMARY OF THE INVENTION

The present invention has been made in view of the above problems. An object of the present invention is to provide a discharge control circuit that prevents reversal of relation between potentials of power voltages which are supplied to a load.

Another object of the present invention is to provide a discharge control circuit in which a delay time of a delay circuit can be easily changed, thereby allowing control sequence in power-on and power-off to be freely set.

Still another object of the present invention is to provide a current source circuit which is independent of a power voltage or temperature and which is suitable for constituting a delay circuit included in a discharge control circuit.

To achieve at least one of the abovementioned objects, according to an aspect of the present invention, a discharge control circuit includes:

discharge elements;

logic circuits each of which controls turning-on and turning-off the discharge elements based on a control signal inputted externally; and at least one delay circuit that delays an output signal of a first logic circuit among the logic circuits, wherein the discharge control circuit pulls out charges from a corresponding terminal in response to turning-on of the discharge elements, a signal delayed by the delay circuit is inputted to a second logic circuit among the logic circuits so that the discharge elements are controlled in a predetermined order by one control signal.

Alternatively, a discharge control circuit includes:

discharge elements;

logic circuits each of which controls turning-on and turning-off the discharge elements based on a control signal inputted externally; and at least one delay circuit that delays the control signal, wherein the discharge control circuit pulls out charges from a corresponding terminal in response to turning-on of the discharge elements, the control signal or a signal delayed by the delay circuit is inputted to the logic circuits so that the discharge elements are controlled in a predetermined order by one control signal.

The discharge control circuit having the above configuration prevents reversal of relation between potentials of power voltages supplied to a load.

In a case in which the load is a semiconductor integrated circuit, it prevents reversal of the relation between the potentials, and prevents internal parasitic elements from being turned on to cause breakdown.

Preferably, a first stage of at least one of the logic circuits to which the signal delayed by the delay circuit is inputted includes:
a circuit which consists of transistors connected in series and which has a logic threshold that is not affected by ambient temperature and a power voltage,
the transistors comprise:
an enhancement type P-channel MOS transistor;
a depletion type N-channel MOS transistor that includes a gate terminal and a source terminal which are commonly connected; and
an enhancement type N-channel MOS transistor, and
each of the enhancement type P-channel MOS transistor and the enhancement type N-channel MOS transistor includes a gate terminal to which the signal delayed by the delay circuit is inputted.

According to this configuration, a logic threshold voltage of a logic circuit subsequent to the delay circuit becomes constant even if a power voltage or ambient temperature fluctuates. Therefore, the logic circuit operates at a precise time to turn on the discharge elements.

Preferably, the delay circuit includes:
a current source circuit that provides a constant current; and
a capacitor charged by the current provided by the current source circuit, and
the delay time depends on an amount of the current provided by the current source circuit and a capacitance value of the capacitor.

According to this configuration, the delay time is changed by changing the current amount of the current source circuit or the capacitance value of the capacitor. It realizes a discharge control circuit in which the control sequence in power-on and power-off can be freely set.

Preferably, the delay circuit includes:
a switch element that passes or cuts off the current provided by the current source circuit;
an inverting circuit that inverts an output signal of the delay circuit; and
an AND circuit to which an output signal of the inverting circuit and an input signal are inputted,
the switch element includes a control terminal to which an output signal of the AND circuit is inputted, and
a predetermined time after the switch element is turned on by the input signal, the output signal of the AND circuit changes in accordance with change in the output signal of the delay circuit, and the switch element is turned off regardless of the input signal so that the current that charges the capacitor is cut off.

According to this configuration, after the predetermined delay time is clocked, the current output from the current source circuit is cut off. It reduces current consumption of the circuit.

According to another aspect of the present invention, a current source circuit provides a constant current used by a delay circuit, the current source circuit including:
a first depletion type MOS transistor that includes a source terminal and a gate terminal; and
a resistance element which has positive temperature characteristics and which is connected between the source terminal of the first depletion type MOS transistor and a power voltage terminal or a ground terminal,
wherein the gate terminal of the first depletion type MOS transistor is connected to the power voltage terminal or a ground terminal.

This configuration provides a current source circuit which is independent of a power voltage and temperature and which is suitable for constituting a delay circuit included in a discharge control circuit.

Preferably, the first depletion type MOS transistor is an element formed on a semiconductor chip, and
the resistance element is constituted by a well region formed simultaneously with a well region constituting a substrate of the first depletion type MOS transistor.

Preferably, the first depletion type MOS transistor is an element formed on a semiconductor chip, and
the resistance element is constituted by an active region formed simultaneously with active regions constituting a source region and a drain region of the first depletion type MOS transistor.

Preferably, the resistance element is constituted by an enhancement type MOS transistor including a gate terminal to which a predetermined voltage is applied.

Preferably, the first depletion type MOS transistor is of a N-channel type,
the gate terminal of the first depletion type MOS transistor is connected to the ground terminal, and
the resistance element is connected between the source terminal of the first depletion type MOS transistor and the ground terminal.

Preferably, the first depletion type MOS transistor is of a P-channel type,
the gate terminal of the first depletion type MOS transistor is connected to the power voltage terminal, and
the resistance element is connected between the source terminal of the first depletion type MOS transistor and the power voltage terminal.

Preferably, a second depletion type MOS transistor and an adjuster circuit including a fuse element or a switch element are connected in parallel or in series with the first depletion type MOS transistor.

Preferably, the delay circuit includes:
a capacitor that is charged or discharged by a current provided by the current source circuit; and
a voltage comparator circuit that detects a charged voltage of the capacitor.

Preferably, the delay circuit includes:
an oscillator circuit; and
a counter circuit that counts signals of a predetermined frequency which is generated by the oscillator circuit, and
the oscillator circuit includes:
a capacitor that is charged or discharged by a current provided by the current source circuit; and
a voltage comparator circuit that detects a charged voltage of the capacitor, or an inverter.

The present invention provides a discharge control circuit that prevents reversal of relation between potentials of power voltages supplied to a load. The present invention further provides a discharge control circuit in which a delay time of the delay circuit can be easily changed, thereby allowing control sequence in power-on and power-off to be freely set. The present invention further provides a current source circuit which is independent of a power voltage and temperature and which is suitable for constituting a delay circuit included in a discharge control circuit.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

FIG. 1A and FIG. 1B are circuit configuration diagrams showing examples of a discharge control circuit according to the present invention.

DETAILED DESCRIPTION OF THE PREFERRED EMBODIMENT

Hereinafter, a suitable embodiment of the present invention will be described with reference to figures.

FIG. 1A shows a first embodiment of a discharge control circuit according to the present invention.

The discharge control circuit 10 according to the embodiment includes:

a first logic circuit 11A that receives a control signal CE inputted externally;

a first discharge circuit 12A controlled by being switched on and off by an output signal of the logic circuit 11A;

a delay circuit 13 that delays the output signal of the first logic circuit 11A;

a second logic circuit 11B to which an output signal of the delay circuit 13 is inputted; and a second discharge circuit 12B controlled by being switched on and off by an output signal of the logic circuit 11B.

These circuits may be included in a semiconductor integrated circuit (IC) on one semiconductor chip. Alternatively, the discharge circuits 12A, 12B and other circuits may be included in separate semiconductor integrated circuits (IC) respectively.

FIG. 1B shows a second embodiment of the discharge control circuit according to the present invention.

The discharge control circuit according to the embodiment includes:

a first logic circuit 11A that receives a control signal CE inputted externally;

a first discharge circuit 12A controlled by being switched on and off by an output signal of the logic circuit 11A;

a delay circuit 13 that delays the control signal CE;

a second logic circuit 11B to which an output signal of the delay circuit 13 is inputted; and a second discharge circuit 12B controlled by being switched on and off by an output signal of the logic circuit 11B.

In the examples in FIG. 1A and FIG. 1B, the first discharge circuit 12A and the second discharge circuit 12B include N-channel MOS transistors M11, M12, . . . , M1$n$ and M21, M22, . . . , M2$n$ for discharge as discharge elements. Output signals of the corresponding logic circuits 11A, 11B are inputted to gate terminals of the MOS transistors respectively. Each of the first discharge circuit 12A and the second discharge circuit 12B may include at least one discharge MOS transistor. Source terminals of the MOS transistors M11, M12, . . . , M1$n$ and M21, M22, . . . , M2$n$ are respectively connected to ground terminals GND to which a ground potential is applied. Drain terminals of the MOS transistors are respectively connected to external terminals Vo11, Vo12, . . . , Vo1$n$ and Vo21, Vo22, . . . , Vo2$n$.

The examples in FIG. 1A and FIG. 1B include two logic circuits 11A, 11B and two discharge circuits 12A, 12B. However, three or more logic circuits and three or more discharge circuits may be provided. In that case, as for the example of FIG. 1A, a delay circuit is provided between each pair of logic circuits. As for the example of FIG. 1B, a delay circuit is provided between each pair of an input terminal of the control signal CE and an input terminal of one of the logic circuits except for the logic circuit 11A.

Figure 2A:
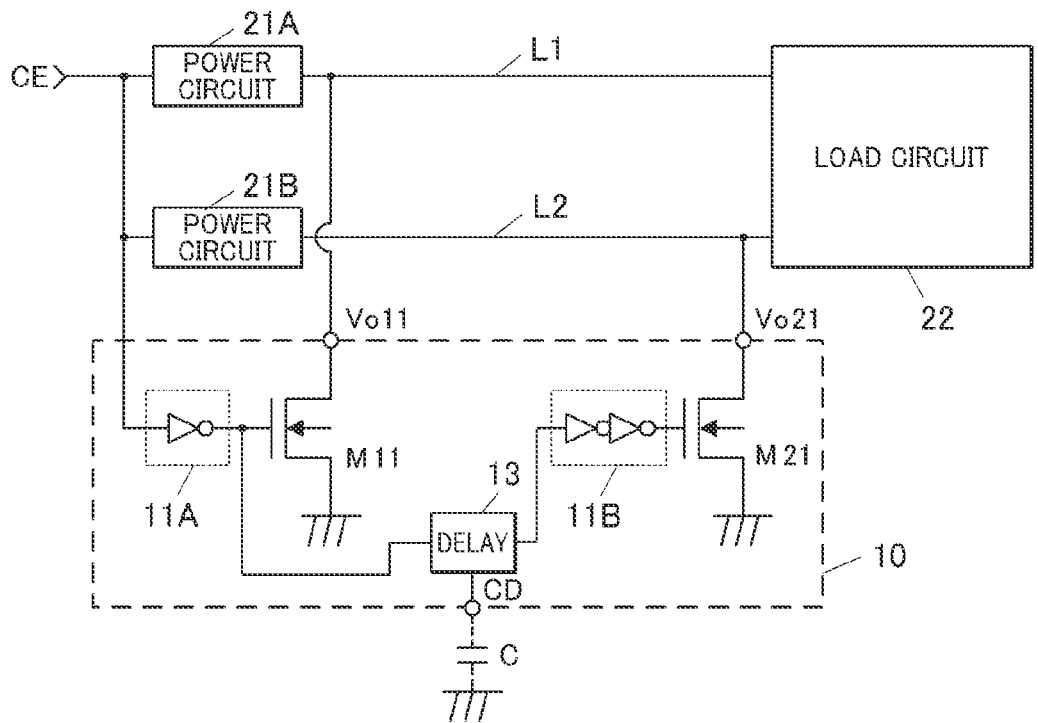
FIG. 2A and FIG. 2B are circuit configuration diagrams showing examples of a system using the examples of the discharge control circuit in FIG. 1A and FIG. 1B.
Figure 2B:
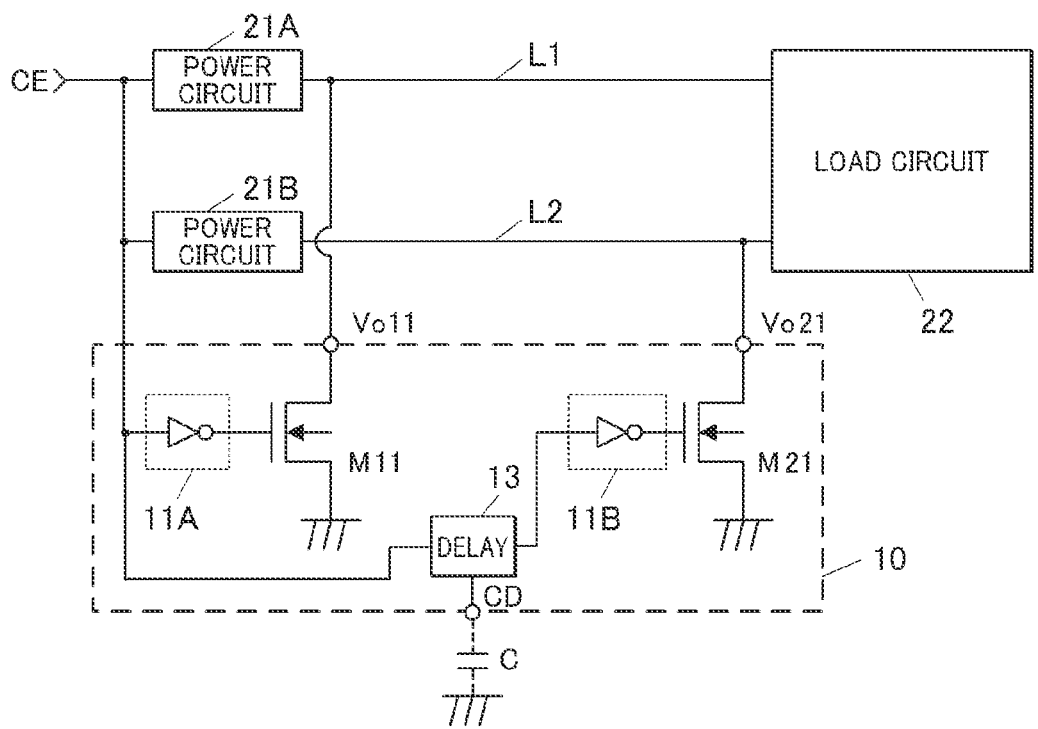

FIG. 2A and FIG. 2B illustrate examples of a system using the examples of the discharge control circuit in FIG. 1A and FIG. 1B. In each of FIG. 2A and FIG. 2B, a portion surrounded by a broken line is a discharge control circuit 10. The discharge control circuit 10 is a semiconductor integrated circuit on, for example, one silicon semiconductor substrate. Alternatively, the discharge control circuit 10 may be constituted by discrete parts.

Each of the systems shown in FIG. 2A and FIG. 2B includes:

power circuits 21A, 21B, such as regulators and DC/DC converters, that generate power voltages Vreg1, Vreg2 with different potentials (e.g., 3.3V and 1.5V), respectively.

a load circuit 22 to which a current is supplied from the power circuits 21A, 21B, and which includes devices such as a CPU (microprocessor), a SoC (system-on-chip), and a system LSI; and the discharge control circuit 10 according to the example in FIG. 1A or FIG. 1B.

In FIG. 2A, a signal obtained by inverting the control signal CE with an inverter is input to the delay circuit 13. The logic circuit 11B consists of two inverters. On the other hand, in FIG. 2B, the control signal CE is input directly to the delay circuit 13. The logic circuit 11B consists of one inverter.

The delay circuit 13 constituting the discharge control circuit 10 includes an external capacitor C for setting a delay time as described later. The capacitor C is shown in FIG. 2A and FIG. 2B. The number of inverters (logic gates) in the logic circuit 11A constituting the discharge control circuit 10 is not limited to the number shown in the figures. The number is set appropriately in accordance with a circuit to which the inverters are be applied.

In the systems of FIG. 2A and FIG. 2B, when the control signal CE is changed from a high level to a low level, operation of the power circuit 21A, 21B stops, and the MOS transistor M11 serving as a discharging element is turned on. Charges are extracted from a power supply line L1 that supplies a power voltage Vreg1 to the load circuit 22 from the power circuit 21A. First, the power voltage Vreg1 falls. Then, after a delay time caused by the delay circuit 13 passes, the MOS transistor M21 is turned on. Charges are pulled out from a power line L2 that supplies a power voltage Vreg2 to the load circuit 22 from the power circuit 21B. The power voltage Vreg2 falls.

According to the example of the discharge control circuit 10, in a case in which the load circuit 22 is a device having constraints on the power-off sequence (power-off order), the above operation falls the power voltage Vreg1 ahead of Vreg2. It prevents breakdown of internal elements. The delay time can be changed by changing a capacitance value of the external capacitor C. It brings advantage that the optimum delay time is easily set in accordance with a load capacity, etc.

Example of Delay Circuit

Figure 3:
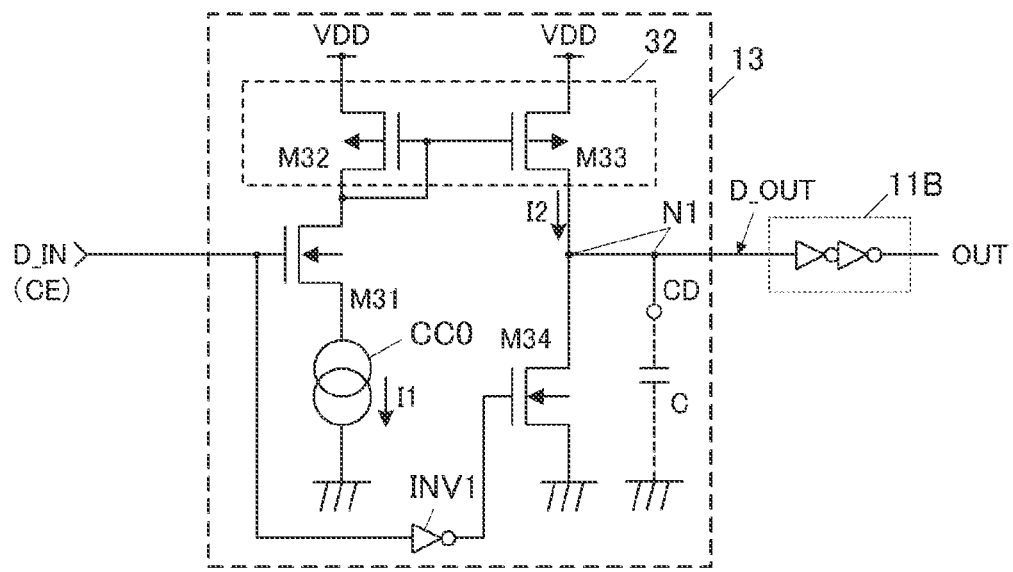
FIG. 3 is a circuit diagram showing an example of a delay circuit constituting the examples of the discharge control circuit.

Next, an example of the delay circuit 13 constituting the discharge control circuit 10 will be described. FIG. 3 shows a first example of the delay circuit 13.

As shown in FIG. 3, the first example of the delay circuit 13 includes:

a MOS transistor M31 that includes a gate terminal to which an input signal (output signal D_IN of the logic circuit 11A, or control signal CE) is inputted;

a constant current source CC0 connected between a source terminal of the transistor M31 and a ground point GND;

a current mirror circuit 32 that consists of MOS transistors M32, M33 provided on a drain terminal side of the transistor M31;

a MOS transistor M34 connected in series with the MOS transistor M33;

an external capacitor C connected between a ground point GND and a connection node N1 between the transistors M33, M34; and an inverter INV1 that supplies a signal to a gate terminal of the MOS transistor M34, the signal being obtained by inverting an input signal.

The symbol "CD" represents an external terminal to which the capacitor C is connected. The symbol "11B" represents a logic circuit in the next stage.

Figure 4:
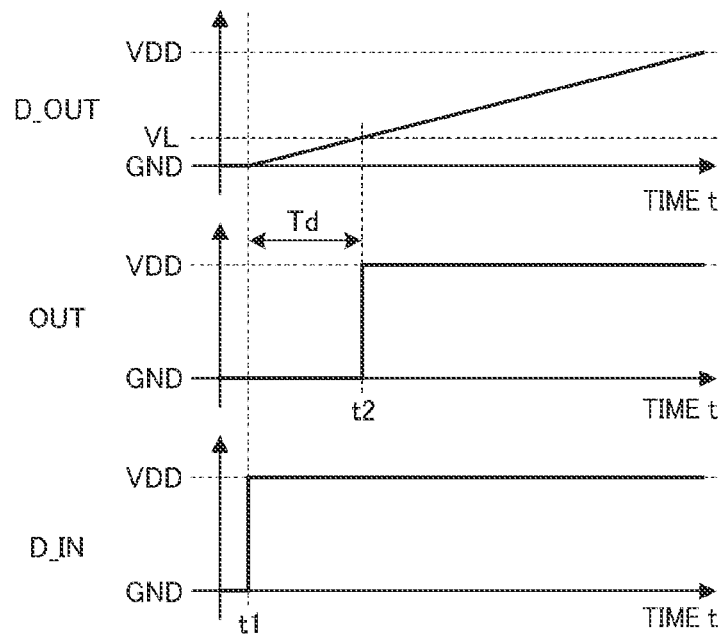
FIG. 4 is a timing chart showing operation time of the delay circuit in FIG. 3.

FIG. 4 shows changes in the input signal D_IN and an output signal D_OUT of the delay circuit 13, and an output signal OUT of the logic circuit 11B in FIG. 3.

As is known from FIG. 4, in the delay circuit 13 of the example, when the input signal D_IN rises at a time point t1, the MOS transistor M34 is turned off and M31 is turned on. A predetermined current I1 determined by a constant current source CC0 is supplied to the MOS transistor M32. Thus, a current I2 in accordance with a current mirror ratio is supplied to the MOS transistor M33. The capacitor C is charged, and a potential of the output signal D_OUT is gradually increased. Then, at a time point t2 when the potential of the output signal D_OUT reaches a logic threshold voltage VL of the logic circuit 11B in the subsequent stage, the output signal OUT of the logic circuit 11B changes to a high level from a low level. The period between the times t1, t2 is a delay time Td of the delay circuit 13.

In the delay circuit 13 shown in FIG. 3, the delay time Td is expressed by the following equation.

$$Td = VL \times C/I2 \qquad (1)$$

Therefore, the delay time Td can be set to any value by changing a capacitance value of the external capacitor C. It is also known from Equation (1) that a constant and stable delay time Td is obtained by reducing dependency of the logic threshold voltage VL of the logic circuit 11B and the current I2 that charges the capacitor C on the power voltage and temperature. Therefore, the embodiment is configured to reduce the dependency of the logic threshold voltage VL of the logic circuit 11B and the current I2 of the constant current source CC0 on the power voltage and temperature, as will be described later. That is, the embodiment is configured such that the logic threshold voltage VL and the current I2 is constant even if the power voltage and ambient temperature fluctuate.

In the delay circuit 13 of FIG. 3, when the input signal D_IN falls, the MOS transistor M31 is turned off, and M34 is turned on. Therefore, the capacitor C is immediately discharged, and the potential of the output signal D_OUT falls quickly.

Figure 5:
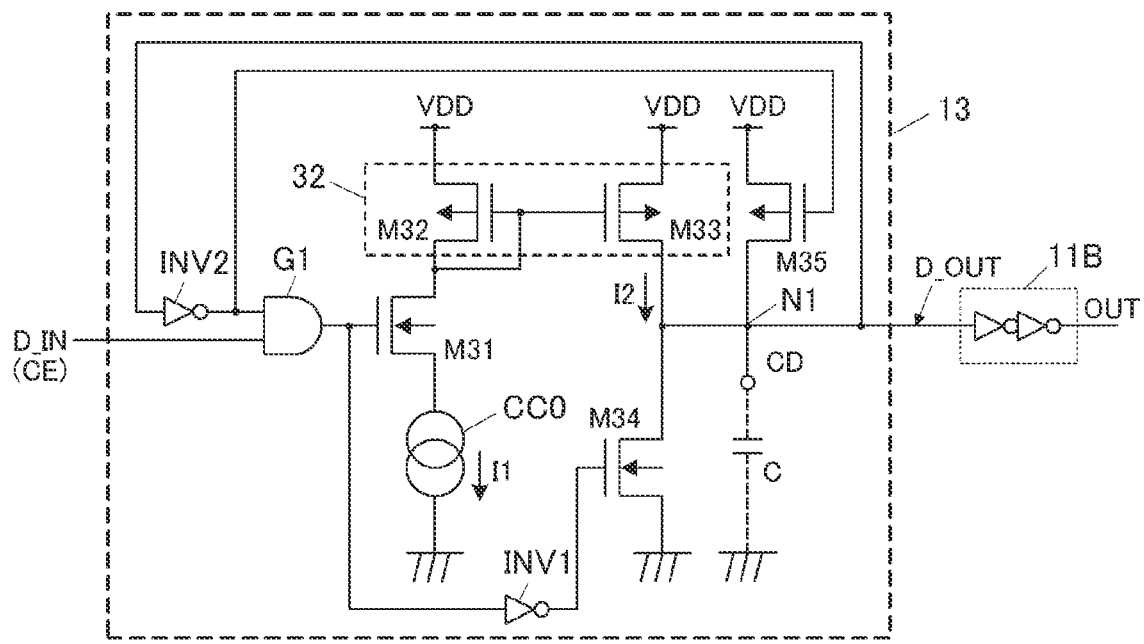
FIG. 5 is a circuit diagram showing another example of the delay circuit constituting the examples of the discharge control circuit.

FIG. 5 shows a second example of the delay circuit 13. In the first example of the delay circuit, even after the delay time passes, the constant current I1 and the current transferred by the current mirror circuit 32 flows steadily. In view of this, the second example of the delay circuit 13 has a function of reducing current consumption by turning off the MOS transistor M31 after a predetermined time.

As shown in FIG. 5, the second example of the delay circuit 13 additionally includes an AND gate G1 at a stage preceding the MOS transistor M31 in the first example of the delay circuit in FIG. 3. One signal inputted to the AND gate G1 is D_IN. The other signal inputted to the AND gate G1 is a signal obtained by inverting the output signal D_OUT with an inverter INV2. Further, a MOS transistor M35 for pull-up is provided between an output node N1 of the delay circuit 13 and a power voltage terminal VDD. A signal inverted by the inverter INV2 is inputted to a gate terminal of M35. The inverter INV2 is designed such that a logical threshold of an input is a potential close to a power supply (e.g., a potential dropped from VDD by a threshold voltage Vth of a PMOS transistor).

Figure 6:
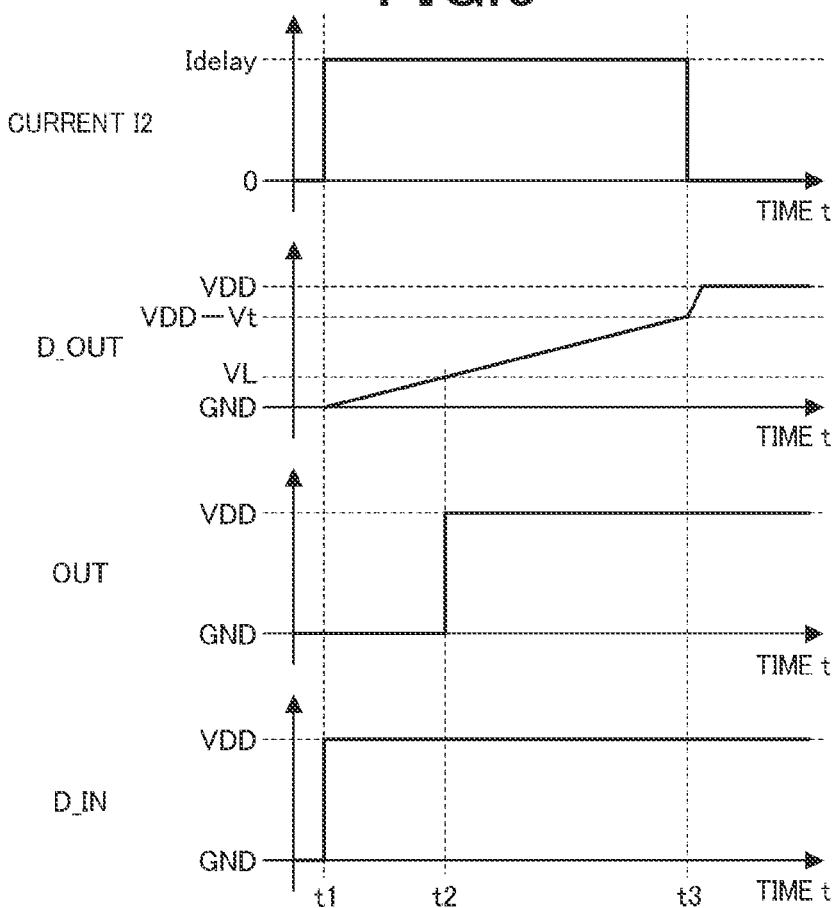
FIG. 6 is a timing chart showing operation time of the delay circuit in FIG. 5.

FIG. 6 shows changes in voltages of portions of the delay circuit 13 shown in FIG. 5. In FIG. 6, the "current I2" is the current of the transistor M33 constituting the current mirror circuit 32 of the delay circuit 13 in FIG. 5. Idelay is a current value of the current I2. When the transistor M31 is turned on at the time point t1, the current I1 of the constant current source CC0 flows to the transistor M32, and is returned by the current mirror circuit 32. The current I2 of M33 is increased to Idelay. Finally, the transistor M31 is turned off at a time point t3, and I2 also becomes zero.

As shown in FIG. 6, in the delay circuit 13 of FIG. 5, when the input signal D_IN changes to a high level at the time point t1, an output of the AND gate G1 changes to a high level, and the MOS transistor M31 is turned on. This is because a potential of the output node N1 is at a low level while an output of the inverter INV2 is at a high level at that time point. Then, a current flows through the current mirror circuits M32, M33. The capacitor C is charged, and a potential D_OUT of the node N1 gradually rises. At the time point t2 when the potential D_OUT reaches the logic threshold voltage VL of the logic circuit 11B in the subsequent stage, the output signal OUT of the logic circuit 11B changes to a high level from a low level.

After the output signal OUT changes to a high level, the potential D_OUT of the node N1 continues to rise further. When the potential D_OUT reaches a logical threshold (VDD-Vth) of the inverter INV2, the output of the inverter INV2 is inverted at a time point t3, and the MOS transistor M31 is turned off. Currents of the current mirror circuits M32, M33 are cut off, and charging of the capacitor C is stopped. Simultaneously with the turning-off of M31, the MOS transistor M35 for pull-up is turned on. It lifts the potential D_OUT of the node N1 to a power voltage VDD. This avoids chattering caused by the inverter INV2 repeating inversion. The MOS transistor M35 is designed to have driving performance lower than that of the MOS transistor M34. When the input signal D_IN changes to a low level, the MOS transistor M34 is turned on. Thus, the potential of the node N1 changes to a low level.

The first and second examples show a method of charging the capacitor C with a constant current and making a delay time when the input signal D_IN changes to a high level from a low level. Similarly, a current for discharging the capacitor C may be controlled by connecting a constant current source or the like in series with the MOS transistor M34. When the input signal D_IN changes to a low level from a high level, a delay time can be made. The delay time may be made both when the input signal D_IN changes to a high level from a low level and when the input signal D_IN changes to a low level from a high level.

In the above example, the current mirror circuit is used as a current source for charging the capacitor C. However, in a case in which the delay time does not have to be accurate, an RC delay circuit in which the current mirror circuit is replaced with a resistance element may be used. In a case in which the delay time needs to be more accurate or a case in which the delay time needs to be longer, a timer circuit described below may be used as the delay circuit.

Figure 7:
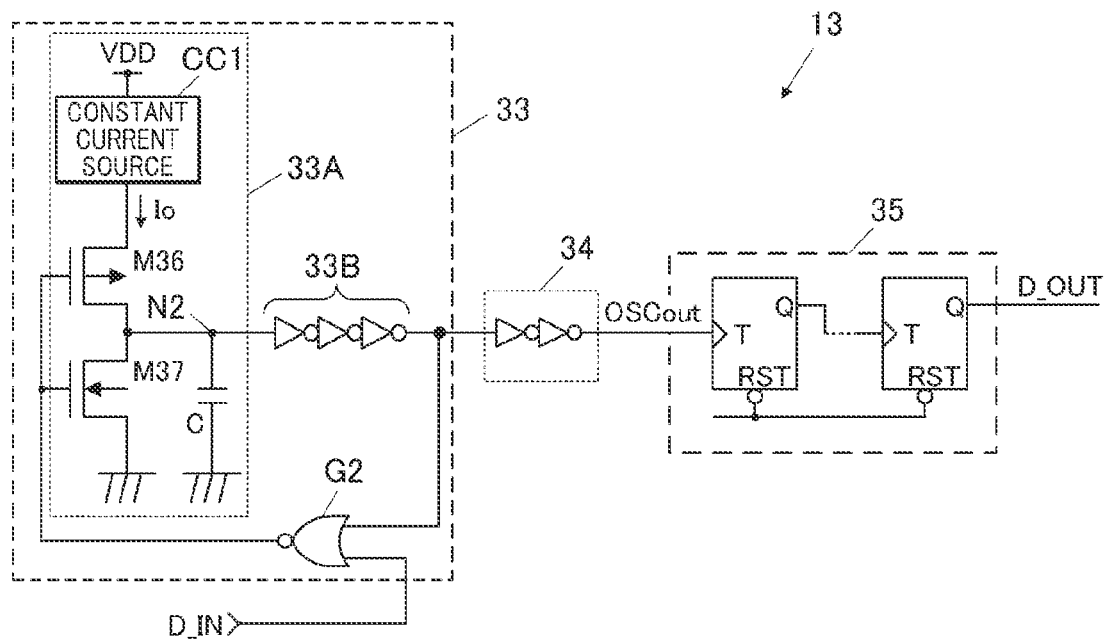
FIG. 7 is a circuit diagram showing another example of the delay circuit constituting the examples of the discharge control circuit.

FIG. 7 shows a third example of the delay circuit 13. In this example, a timer circuit is used as the delay circuit.

As shown in FIG. 7, the third example of the delay circuit 13 includes:

an oscillator circuit 33;

a wave-shaping circuit 34 that includes inverters (two inverters in the figure) connected in series; and a counter circuit 35 that includes flip-flops connected in series.

The oscillator circuit 33 is combination of a triangle wave generation circuit 33A and a ring oscillator.

The triangle wave generation circuit 33A includes:

a constant current source CC1 and MOS transistors M36, M37 connected in series between a power voltage terminal VDD and a ground point; and a capacitor C connected between a ground point and a connection node N2 between M36 and M37.

An inverter line 33B consisting of an odd number (three in the figure) of inverters are connected to the connecting node N2. An output signal of the inverter line 33B is returned to gate terminals of the MOS transistors M36, M37 constituting the triangle wave generation circuit 33A. Thus the ring oscillator is formed. For example, an NOR gate G2 is provided in the middle of the return path. The output signal of the inverter line 33B is input to one terminal of the NOR gate G2. A signal D_IN to be delayed is input to the other input terminal of the NOR gate G2. A wave of an output of the oscillator circuit 33 is shaped by the wave-shaping circuit 34 to become a pulse signal. The number of pulses is counted by being inputted to the pulse signal counter circuit 35. When the counter circuit 35 has counted a predetermined number of pulse signals, the output changes to a high level. A signal D_OUT obtained by delaying the input signal D_IN is outputted. Thus, operation as a delay circuit is performed. The number of inverters in the inverter line 33B may be an even number. In that case, an OR gate is used as G2.

Figure 8:
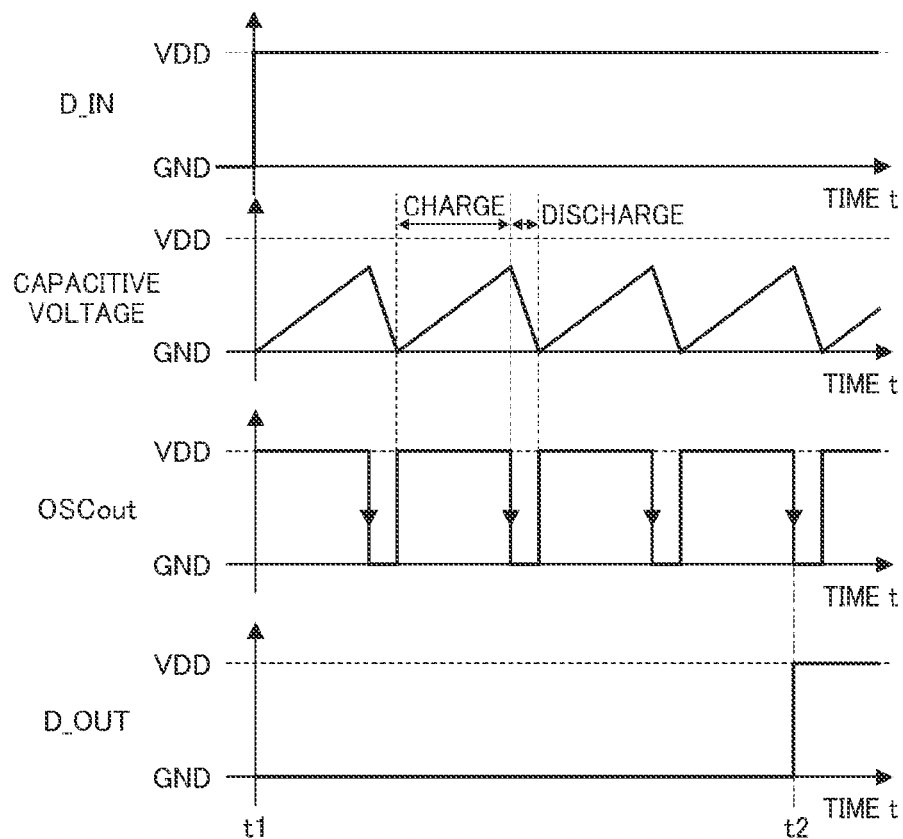
FIG. 8 is a timing chart showing operation time of the delay circuit in FIG. 7.

FIG. 8 shows changes in voltages of portions of the delay circuit 13 shown in FIG. 7.

As shown in FIG. 8, in the delay circuit 13 of FIG. 7, at the time point t1 when the input signal D_IN changes to a high level, the oscillator circuit 33 begins operation. When the counter circuit 35 has counted a predetermined number (four in the figure) of pulse signals, a counter output i.e. D_OUT changes to a high level at the time point t2. The number of pulses counted by the counter circuit 35 depends on the number "n" of stages of the flip-flops connected in series. That is, the counter circuit 35 counts the square of "n". Therefore, the number of stages of the flip-flops is set in accordance with an oscillation frequency of the oscillator circuit 33 and a necessary delay time.

Also in the delay circuit of the example in FIG. 7, the capacitor C may be connected as an external element so that any delay time can be set.

As described above, according to the above example, a delay time of the delay circuit can be adjusted (changed) by changing a capacitance value of the external capacitor C. Alternatively, the delay time of the delay circuit may be adjusted (changed) by changing a current value of a current source circuit instead of changing a capacitance value of the capacitor C.

Example of Logic Circuit

Methods for making the logic circuit 11B will be described with reference to FIG. 9A to FIG. 9C. In the logic circuit 11B, the logic threshold voltage VL is constant even if the power voltage and ambient temperature fluctuate.

Figure 9A:
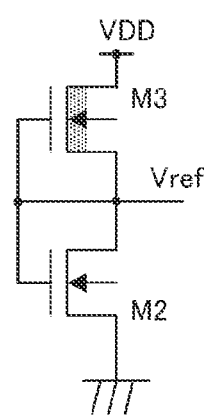
FIG. 9A, FIG. 9B, and FIG. 9C are circuit diagrams showing how to make a subsequent logic circuit constituting the examples of the discharge control circuit.

Conventionally, a technique of a reference voltage circuit shown in FIG. 9A is known. In this technique, a depletion type N-channel MOS transistor M3 and an enhancement type N-channel MOS transistor M2 are connected in series. A reference voltage that does not depend on a power voltage and temperature is generated by a circuit with a properly set ratio of channel lengths. A circuit shown in FIG. 9B can be made by applying this technique. This circuit is provided with a depletion type N-channel MOS transistor M3 that includes a gate and a source joined between P-MOS (M1)

and N-MOS (M2) of a CMOS inverter. Thus, a logic circuit having a logic threshold voltage close to the reference voltage is achieved.

Figure 9B:
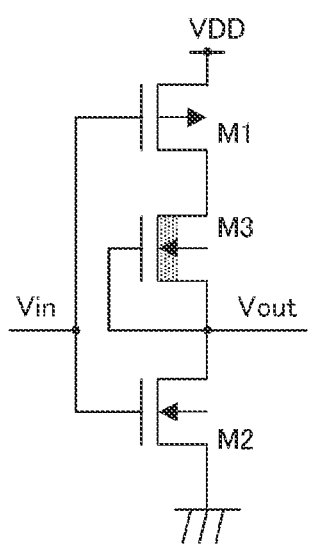
Figure 9C:
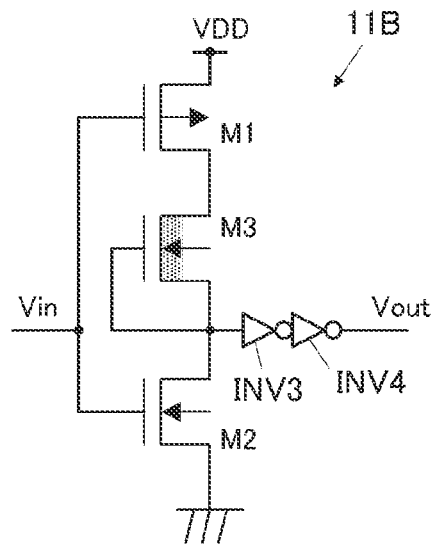

In the circuit of FIG. 9B, M1 is a P-channel MOS transistor. M1 has a function of cutting off a through current by becoming non-active (off) state when an input Vin becomes a value close to the power voltage VDD. However, due to structural reasons, the circuit of FIG. 9B cannot obtain VDD as an output voltage Vout. Therefore, as shown in FIG. 9C, for example, a circuit having two CMOS inverters INV3, INV4 connected in series in the subsequent stage is used as the logic circuit 11B constituting the discharge control circuit 10 in FIG. 1. It achieves a logic circuit that operates at a precise time to turn on discharge elements.

Example of Constant Current Source Circuit

Constant current source circuits that compensate for change in temperature will be described with reference to FIG. 10, FIG. 11 and FIG. 12. These circuits provide constant currents even if ambient temperature fluctuates.

Conventionally, constant current source circuits that compensate for change in temperature have been proposed.

For example, a circuit in the above JP H05-235661A includes:
a differential amplifier having an input terminal to which a reference voltage of a reference voltage source is applied;
a transistor having a base terminal to which an output voltage of the differential amplifier is applied; and
an emitter resistor connected in series with the transistor.

To compensate for temperature characteristics of a constant current output due to temperature characteristics of the emitter resistor, characteristics of compensating for a voltage is given to the reference voltage source by means of temperature characteristics of a diode or transistors connected to form a diode.

The constant current source circuit described in the above JP H05-235661A includes a differential amplifier, diode, and the like. Therefore, there are many elements, and a large area of the circuit is occupied by these elements. Furthermore, in order to improve accuracy of an output current, it is necessary to improve accuracy of the reference voltage source, the diode, and resistors. It brings a problem of difficulty in circuit design. Therefore, the present inventors have developed a constant current source circuit that uses depletion type MOS transistors to compensate for change in temperature with a small number of elements to output a constant current. This circuit will be described below.

Figure 10A:
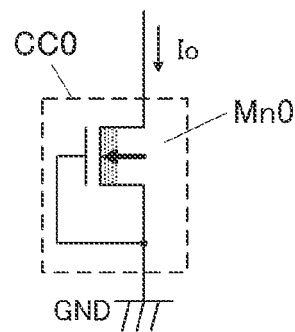
FIG. 10A and FIG. 10B are circuit diagrams showing examples of a conventional constant current source circuit using a depletion type MOS transistor.
Figure 10B:
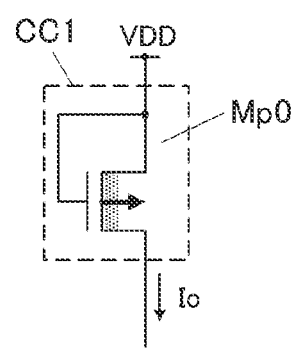

Conventionally, techniques using a depletion type MOS transistor as a current source circuit have been proposed. FIG. 10A and FIG. 10B show examples of such a current source circuit. FIG. 10A shows an example in which a depletion type N-channel MOS transistor Mn0 is used. FIG. 10B shows an example in which a depletion type P-channel MOS transistor Mp0 is used. In each example, a gate terminal is commonly connected to a source terminal.

In the circuit of FIG. 10, a voltage Vgs between gate and source is 0V. Therefore, a current Ids between drain and source is expressed by the following equation.

$$Ids = \{(\mu eff \times Cox \times W)/(2 \times L)\} \times (Vgs - Vth)^2 = \quad (2)$$
$$\{(\mu eff \times Cox \times W)/(2 \times L)\} \times (-V_{th})^2$$

In the expression, µeff is a carrier mobility. Cox is a capacitance value per unit area of a gate insulating film. W is a channel width. L is a channel length. Vth is a threshold voltage of the MOS transistor.

In above Equation (2), mainly µeff and Vth affect temperature characteristics of Ids. The µeff has a negative temperature coefficient and has a negative effect on temperature dependence of the current between drain and source. Vth has a negative temperature coefficient and has a positive effect on the temperature dependence of the current between drain and source of the depletion type MOS transistor. As for effects of the above two temperature coefficients, the positive effect by Vth is larger than the negative effect by µeff. Therefore, the current Ids between drain and source has positive temperature dependence. That is, the higher the temperature, the larger the current Ids.

JP2011-150675A discloses an invention having a resistance with a negative temperature characteristics in a current mirror circuit including an enhancement type MOS transistor to which a depletion type MOS transistor is connected on the primary side in order to compensate for the above positive temperature dependence of the current Ids between drain and source. However, the current source circuit of JP2011-150675A includes many elements since it has a current mirror circuit. It brings a problem that the circuit occupies a larger area.

Figure 11A:
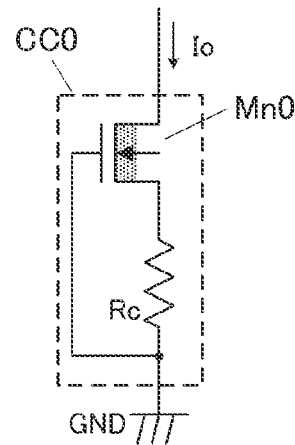
FIG. 11A and FIG. 11B are circuit diagrams showing examples of a constant current source circuit of the present invention using a depletion type MOS transistor.
Figure 11B:
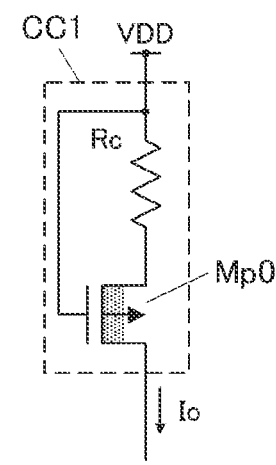

FIG. 11A and FIG. 11B show examples of a constant current source circuit developed by the inventors.

FIG. 11A is an example in which a depletion type N-channel MOS transistor Mn0 is used. FIG. 11B is an example in which a depletion type P-channel MOS transistor Mp0 is used. In each example, a resistor Rc that compensates for temperature is connected between a source terminal and a ground point or a power voltage terminal. A gate terminal is commonly connected to the source terminal. A ground potential GND (0V) or a power voltage VDD is applied to the gate terminals of Mn0 and Mp0. Elements with positive temperature characteristics are used for the resistor Rc.

In silicon semiconductor devices, a well resistance, a diffusion resistance, and the like are resistances having positive temperature dependence. They are readily formed on a semiconductor chip through current manufacture process of silicon semiconductors. Specifically, a well resistance is formed utilizing a region formed simultaneously with a well region where a source region and a drain region of a MOS transistor are formed. A diffusion resistance is formed utilizing an active region (diffusion layer) formed simultaneously with a diffusion layer constituting a source region and a drain region.

In the constant current source circuits of FIG. 11A and FIG. 11B, when a current flows through a resistor Rc, potential drop of "Rc×Ids" occurs. A current Ids between drain and source is expressed by the following equation.

$$Ids = \{(\mu eff \times Cox \times W)/(2 \times L)\} \times (Vgs - Vth)^2 = \quad (3)$$
$$\{(\mu eff \times Cox \times W)/(2 \times L)\} \times (-Rc \times Ids - V_{th})^2$$

The depletion type MOS transistor has a negative threshold voltage Vth. Therefore, the resistor Rc reduces the voltage Vgs between gate and source by "Rc×Ids". It reduces the current Ids between drain and source.

Since a resistor having positive temperature characteristics is used, temperature dependence of the term "Rc×Ids" can be set to a small value at low temperature and to a large value at high temperature. Accordingly, an amount of reduction in the current Ids between drain and source is small at low temperature and is large at high temperature. Therefore, the term "Rc×Ids" has a negative effect on temperature dependence of the current Ids between drain and source.

The degree of influence of the term "Rc×Ids" can be adjusted by changing a value of the resistor Rc. The degree of influence offsets negative temperature dependence due to the mobility μeff. It makes the temperature characteristics well. A constant current is output regardless of fluctuation in ambient temperature.

Figure 13A:
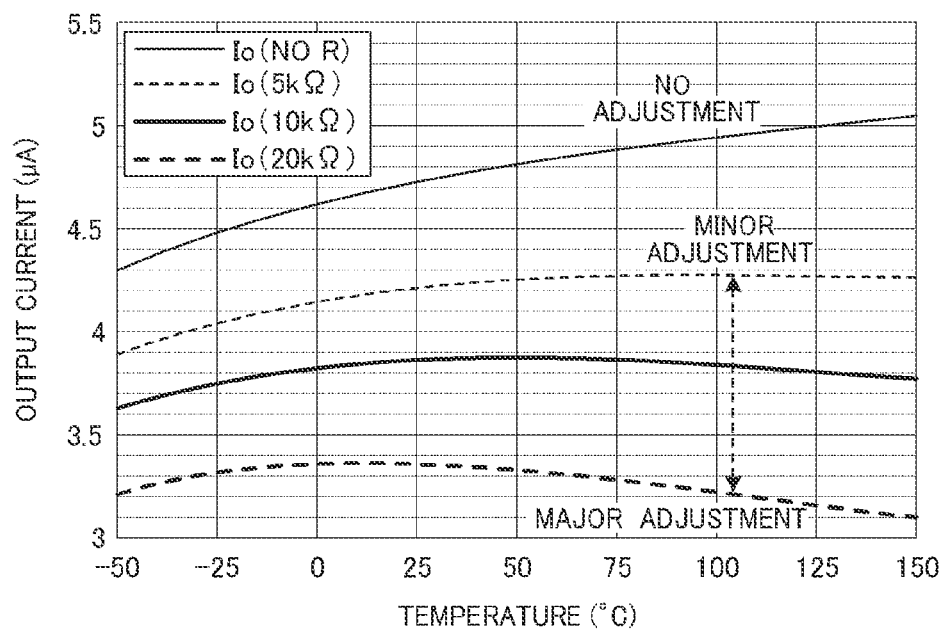
FIG. 13A and FIG. 13B are graphs showing temperature characteristics of the constant current source circuit according to the present invention.
Figure 13B:
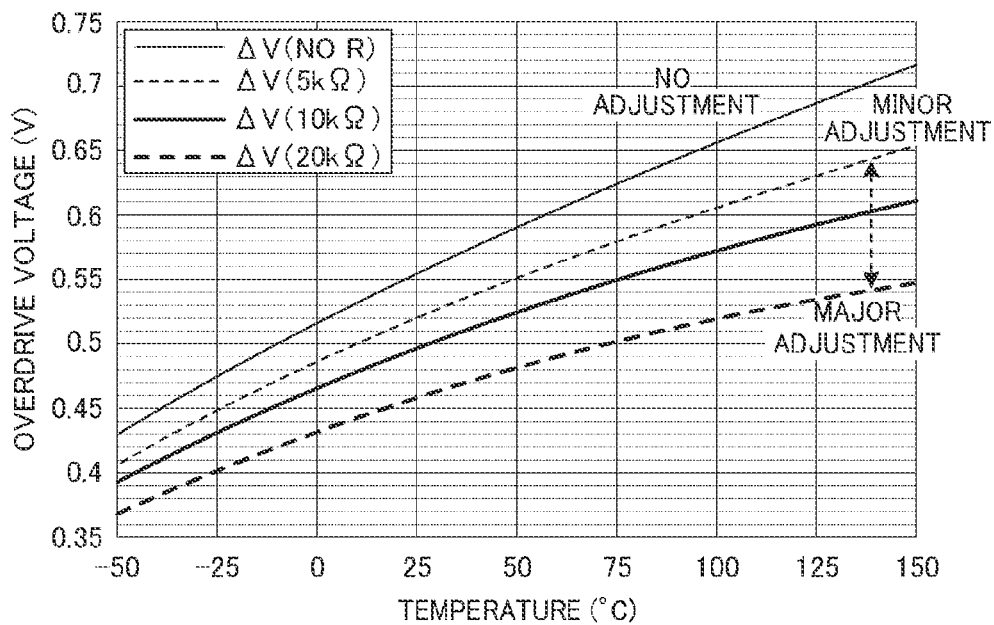

FIG. 13A shows temperature characteristics of an output current Io (current Ids between drain and source) with an adjustment amount being changed by changing the value of the resistor Rc among 5 kΩ, 10 kΩ, and 20 kΩ in the examples of the constant current source circuit in FIG. 11A and FIG. 11B. FIG. 13B shows temperature characteristics of an overdrive voltage ΔV expressed by "Vgs−Vth" with an adjustment amount being changed in the example of the constant current source circuit. In FIG. 13A and FIG. 13B, the temperature characteristics of the output current Io and the overdrive voltage ΔV of the conventional constant current source circuit in FIG. 10 are also shown as examples of "no adjustment," respectively.

As is known from the FIG. 13A, in a circuit without the resistor Rc for temperature compensation, i.e., a conventional constant current source circuit, a current between drain and source is large. It is 4.3 μA at −50° C. and is 5.1 μA at 150° C. The characteristics when adjustment is properly performed by the resistor Rc of 10 kΩ are shown by thick lines. The current between drain and source is 3.7 μA at 150° C., and is 3.9 μA at maximum at about 50° C. Thus, the temperature dependence is smaller.

As is known from FIG. 13A, when a value of the resistor Rc is 5 kΩ, the adjustment amount is insufficient. The current between drain and source is larger at 150° C. than at −50° C.

On the other hand, FIG. 13B shows that the overdrive voltage ΔV is reduced by increasing the adjustment amount. The larger the value of the resistor Rc, the larger the reduction width. It is known from FIG. 13B that the reduction width is made larger at higher temperature than at lower temperature by using a resistor having positive temperature characteristics.

As is known from aforementioned Equation (3), the current Ids between drain and source is affected by variation in the depletion type MOS transistor and the resistor Rc. This variation is caused by the semiconductor fabrication process. If the variation does not satisfy accuracy required for the constant current source circuit, means of adjusting a current is required. Hereinafter, examples of a circuit in which a current adjustment function is given to the constant current source circuit used in the delay circuit 13 will be described.

Constant Current Source Circuit with Current Adjuster

Figure 14:
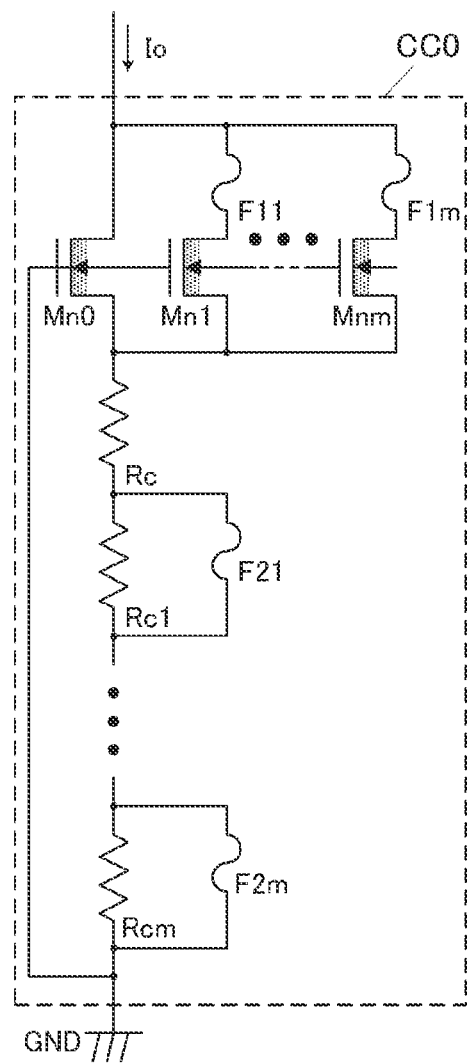
FIG. 14 is a circuit diagram showing an example of a constant current source circuit having a current adjustment function.

FIG. 14 shows a first example of a constant current source circuit with a current adjuster.

In the current source circuit of FIG. 14, a current adjuster is connected in parallel with a depletion type MOS transistor Mn0. The current adjuster consists of pairs of depletion type MOS transistors Mn1-Mnm and fuses F11-F1*m*. A thermal compensation adjuster is connected in series with Mn0. The temperature compensation adjuster consists of pairs of compensation resistors Rc1-Rcm and fuses F21-F2*m*.

Some of the fuses F11-F1*m* connected in parallel with Mn0 are cut to be opened. It reduces the output current Io. Decrease in current changes effect of the term "Rc×Ids" in Equation (2). Therefore, some of the fuses F21-F2*m* connected in series with a resistor Rc are cut to be opened. It increases the resistance value. A constant current source circuit that generates and outputs a current Io having a flat temperature characteristics is achieved.

Figure 15:
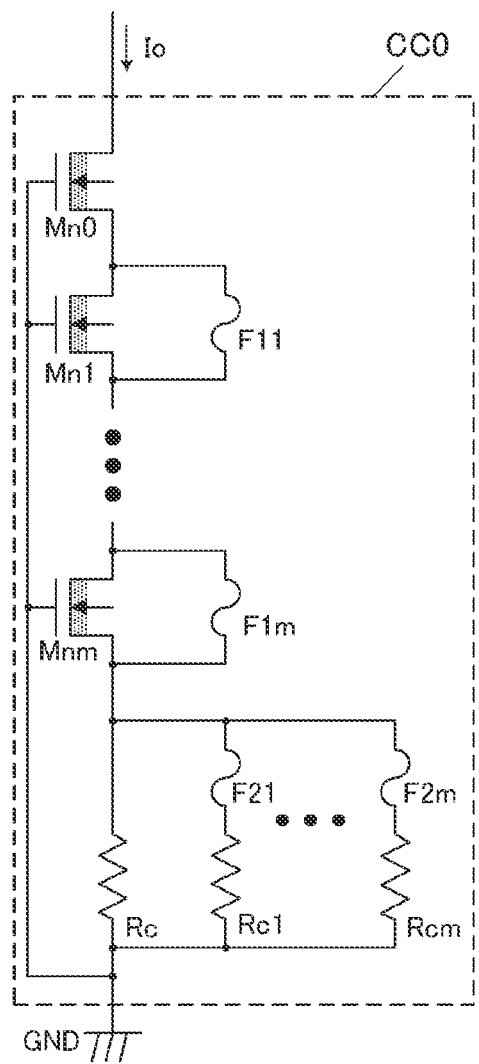
FIG. 15 is a circuit diagram showing another example of the constant current source circuit having the current adjustment function.

FIG. 15 shows a second example of a constant current source circuit with a current adjuster.

In the constant current source of FIG. 15, a current adjuster is connected in series with a depletion type MOS transistor Mn0. The current adjuster consists of pairs of depletion type MOS transistors Mn1-Mnm and fuses F11-F1*m*. A temperature compensation adjuster is connected in parallel with a resistor Rc. The temperature compensation adjuster consists of pairs of compensation resistors Rc1-Rcm and fuses F21-F2*m*.

Some of the fuses F11-F1*m* connected in series with Mn0 are cut to be opened. It reduces an output current Io. Decrease in current changes effect of the term "Rc×Ids" in Equation (2). Therefore, some of the fuses F21-F2*m* connected in parallel with the resistor Rc are cut to be opened. It increases the resistance value. A constant current source circuit that generates and outputs a current Io having a flat temperature characteristics is achieved.

The fuses F11-F1*m*, F21-F2*m* can be constituted by a polysilicon layer, or a polymetal layer consisting of a polysilicon film and a metal film. Cutting by laser irradiation, or cutting by heat generated by passing a current can be applied.

In the constant current source circuits shown in FIG. 14 and FIG. 15, the fuses F11-F1*m*, F21-F2*m* are elements that function as switches. Therefore, they may be replaced by a switch in which a memory element constituting a MOS transistor or EPROM (nonvolatile semiconductor memory) is used.

In addition to the first and second examples, the constant current source circuit may be combination of the current adjuster and the temperature compensation adjuster in FIG. 14 and the current adjuster and the temperature compensation adjuster in FIG. 15.

Modification

Next, a modification of the above example will be described.

Figure 12A:
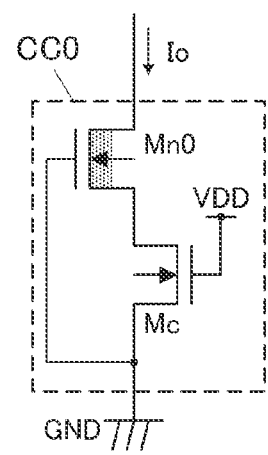
FIG. 12A and FIG. 12B are circuit diagrams showing modifications of the constant current source circuit of the present invention.

FIG. 12 shows the modification of the constant current source circuit. In the constant current source circuit shown in FIG. 12, instead of the resistor Rc for temperature compensation which constitutes the constant current source circuit in FIG. 11, an enhancement type MOS transistor Mc having a gate terminal to which a constant voltage is applied is connected.

In the constant current source circuit of FIG. 12 A, a power voltage VDD is applied to the gate terminal of the MOS transistor Mc. It brings a condition of "Vds<Vgs−Vth". Operation is performed in a linear region. In the linear region of the MOS transistor, a current Ids between drain and source is expressed by the following equation.

$$Ids = \{(\mu_{eff} \times Cox \times W)/L\} \times \{(Vgs-Vth) \times Vds - Vds^2/2\} \qquad (4)$$

In a region where the voltage Vds between drain and source is small, the following relation is obtained from Equation (4).

$$Rds = Vds/Ids = L/\{(\mu_{eff} \times Cox \times W) \times (Vgs-Vth)\} \qquad (5)$$

It is known from Equation (5) that operation as a resistance is performed.

Figure 12B:
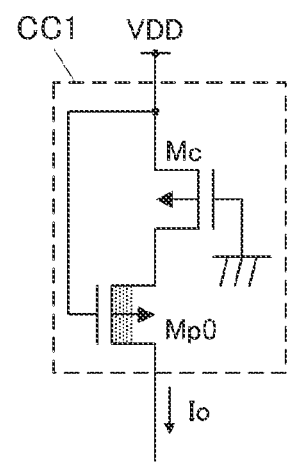

Vgs in Equation (5) is equal to VDD. A value of Vgs is much larger than change in Vth due to temperature. The term "Vgs−Vth" has a very small temperature dependence. On the other hand, the higher the temperature, the smaller the value of μeff. Therefore, the resistance Rds is larger at high temperature and has a positive temperature dependence. However, Equation (5) shows that the resistance Rds depends on VDD. Therefore, it is desirable to be used under a condition where VDD is constant. A constant current source circuit in FIG. 12B is the same as the above.

Figure 16A:
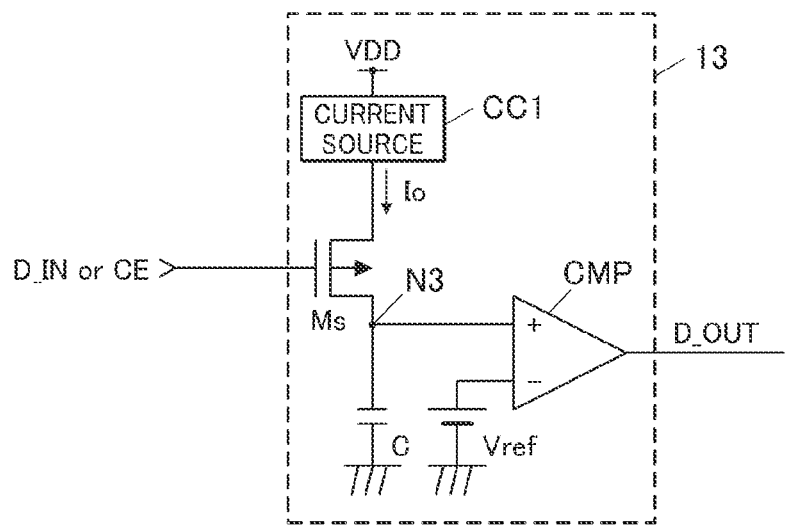
FIG. 16A and FIG. 16B are circuit diagrams showing modifications of the delay circuit constituting the examples of the discharge control circuit.
Figure 16B:
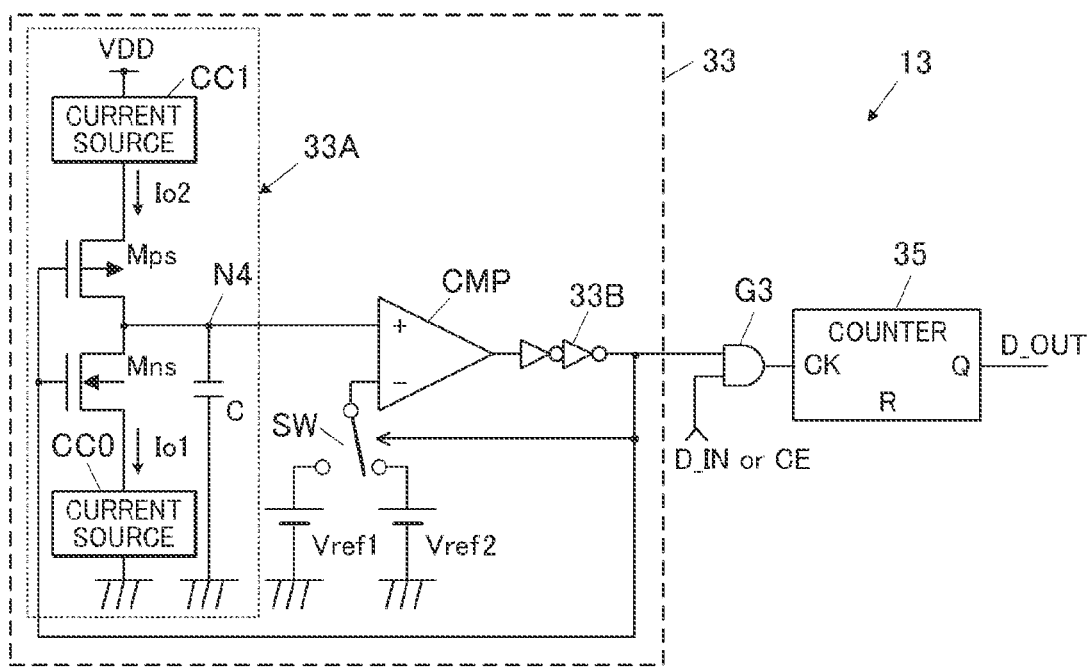

FIG. 16A and FIG. 16B show modifications of the delay circuit 13.

In the delay circuit 13 of FIG. 16A, a constant current source circuit CC1, a switch MOS transistor Ms, and a capacitor C is connected in series between a power voltage terminal VDD and a ground point. A potential of a connection node N3 between the transistor Ms and the capacitor C is input to a non-inverting input terminal of a comparator CMP. The comparator CMP is a voltage comparator circuit including an inverting input terminal to which a reference voltage Vref is applied. An output signal D_IN of a preceding logic circuit 11A, or a control signal CE is input to a gate terminal of the transistor Ms. Transistor Ms is turned on when D_IN or CE changes to a high level. The capacitor C is charged by a current of the constant current source circuit CC1. The potential of the node N3 gradually rises. When the potential of the node N3 exceeds the reference voltage Vref, an output of the comparator CMP is inverted. Thus, a delay time is obtained.

On the other hand, the delay circuit 13 in FIG. 16B is a modification of the delay circuit with the oscillator circuit 33 in FIG. 7. A comparator CMP is provided at a stage preceding an inverter line 33B. A reference voltage applied to an inverting input terminal of a comparator CMP is switched between Vref1 and Vref2 (<Vref1) by a switch SW. In addition to a constant current source circuit CC1 that provides a current to charge a capacitor C, a constant current source circuit CC0 that provides a current to discharge the capacitor C is provided. Switch MOS transistors Mps, Mns are provided between the constant current source circuits CC1, CC0 and a node N4 to which the capacitor C is connected. A feedback signal of an output of the inverter line 33B at a stage following the comparator CMP controls turning-on and turning-off of Mps and Mns. The constant current source circuits CC1, CC0, the capacitor C, and transistors Mps, Mns constitute a triangle wave generation circuit 33A.

An output signal of the inverter line 33B at the stage following the comparator CMP controls switching of the switch SW. Accordingly, a potential of the node N4, which represents a charged voltage of the capacitor C, has a predetermined period that depends on currents of the constant current source circuits CC1, CC0 and a capacitance value of the capacitor C. The potential of the node N4 changes in a form of a triangle wave having a peak of Vref1 and a bottom of Vref2. An output signal (pulse) of the inverter line 33B is input to a counter circuit 35 via an AND gate G3.

An output D_IN of a logic circuit at a preceding stage, or a control signal CE is input to another input terminal of the AND gate G3. When D_IN or CE changes to a high level, the counter circuit 35 begins to count pulses outputted from an oscillator circuit 33. The counter circuit 35 counts a predetermined number so that a predetermined delay time passes. Then, an output D_OUT of the logic circuit changes to a high level.

In the delay circuit having configuration shown in FIG. 16A and FIG. 16B, a charge time and a discharge time of the capacitor C accounts for a majority of a period of the oscillator circuit. The charge time and the discharge time depends on a current value of the constant current source circuit. Therefore, improving temperature dependence of the constant current source circuit brings the same effect as that by improving temperature dependence of the delay time. Therefore, it is desirable to use a constant current source circuit having improved temperature dependence like the above example in FIG. 11 as a constant current source circuit of the oscillator circuit. It provides a precise delay time.

In a case in which high accuracy is not required for the delay circuit in FIG. 16A and FIG. 16B, resistance elements may be used in place of the constant current source circuits CC1, CC0.

The invention made by the inventors has been concretely explained on the basis of the embodiments. However, the present invention is not limited to the embodiments.

Although the embodiments are ICs for controlling discharge, the present invention can also be utilized as a part of an IC for a power supply or the like having other functions, such as a function of controlling regulator. The oscillator circuit with the constant current source circuit, which is used in the embodiment, can also be utilized in ICs and circuits other than the delay circuit (e.g., timer circuit).

What is claimed is:

1. A current source circuit that provides a constant current used by a delay circuit, the current source circuit comprising:
    a first depletion type MOS transistor that includes a source terminal and a gate terminal; and
    a resistance element which has positive temperature characteristics and which is connected between the source terminal of the first depletion type MOS transistor and a power voltage terminal or a ground terminal,
    wherein the gate terminal of the first depletion type MOS transistor is connected to the power voltage terminal or the ground terminal, and
    wherein a second depletion type MOS transistor and an adjuster circuit including a fuse element or a switch element are connected in parallel or in series with the first depletion type MOS transistor.

2. The current source circuit according to claim 1, wherein:
    the first depletion type MOS transistor is an element formed on a semiconductor chip, and
    the resistance element is constituted by a well region formed simultaneously with a well region constituting a substrate of the first depletion type MOS transistor.

3. The current source circuit according to claim 1, wherein:
    the first depletion type MOS transistor is an element formed on a semiconductor chip, and
    the resistance element is constituted by an active region formed simultaneously with active regions constituting a source region and a drain region of the first depletion type MOS transistor.

4. The current source circuit according to claim 1, wherein:
    the resistance element is constituted by an enhancement type MOS transistor including a gate terminal to which a predetermined voltage is applied.

5. The current source circuit according to claim 1, wherein:
    the first depletion type MOS transistor is of a N-channel type, the gate terminal of the first depletion type MOS transistor is connected to the ground terminal, and the resistance element is connected between the source terminal of the first depletion type MOS transistor and the ground terminal.

6. The current source circuit according to claim 1, wherein:

the first depletion type MOS transistor is of a P-channel type, the gate terminal of the first depletion type MOS transistor is connected to the power voltage terminal, and the resistance element is connected between the source terminal of the first depletion type MOS transistor and the power voltage terminal.

7. The current source circuit according to claim 1, wherein the delay circuit comprises:

a capacitor that is charged or discharged by a current provided by the current source circuit; and a voltage comparator circuit that detects a charged voltage of the capacitor.

8. The current source circuit according to claim 1, wherein the delay circuit comprises:

an oscillator circuit; and a counter circuit that counts signals of a predetermined frequency which is generated by the oscillator circuit, wherein the oscillator circuit comprises:

a capacitor that is charged or discharged by a current provided by the current source circuit; and a voltage comparator circuit that detects a charged voltage of the capacitor, or an inverter.

9. A delay system comprising a delay circuit and a current source circuit that provides a constant current to the delay circuit, the current source circuit comprising:

a first depletion type MOS transistor that includes a source terminal and a gate terminal; and a resistance element which has positive temperature characteristics and which is connected between the source terminal of the first depletion type MOS transistor and a power voltage terminal or a ground terminal, wherein the gate terminal of the first depletion type MOS transistor is connected to the power voltage terminal or the ground terminal, and wherein the delay circuit comprises:

an oscillator circuit; and a counter circuit that counts signals of a predetermined frequency which is generated by the oscillator circuit, wherein the oscillator circuit comprises:

a capacitor that is charged or discharged by the current provided by the current source circuit; and a voltage comparator circuit that detects a charged voltage of the capacitor, or an inverter, and wherein an output signal of the counter circuit controls a sequence of power-on and power-off of an external power supply.

10. The delay system according to claim 9, wherein:

the first depletion type MOS transistor is an element formed on a semiconductor chip, and the resistance element is constituted by a well region formed simultaneously with a well region constituting a substrate of the first depletion type MOS transistor.

11. The delay system according to claim 9, wherein:

the first depletion type MOS transistor is an element formed on a semiconductor chip, and the resistance element is constituted by an active region formed simultaneously with active regions constituting a source region and a drain region of the first depletion type MOS transistor.

12. The delay system according to claim 9, wherein:

the resistance element is constituted by an enhancement type MOS transistor including a gate terminal to which a predetermined voltage is applied.

13. The delay system according to claim 9, wherein:

the first depletion type MOS transistor is of an N-channel type, the gate terminal of the first depletion type MOS transistor is connected to the ground terminal, and the resistance element is connected between the source terminal of the first depletion type MOS transistor and the ground terminal.

14. The delay system according to claim 9, wherein:

the first depletion type MOS transistor is of a P-channel type, the gate terminal of the first depletion type MOS transistor is connected to the power voltage terminal, and the resistance element is connected between the source terminal of the first depletion type MOS transistor and the power voltage terminal.

15. A delay system comprising a delay circuit and a current source circuit that provides a constant current to the delay circuit, the current source circuit comprising:

a first depletion type MOS transistor that includes a source terminal and a gate terminal; and a resistance element which has positive temperature characteristics and which is connected between the source terminal of the first depletion type MOS transistor and a power voltage terminal or a ground terminal, wherein the gate terminal of the first depletion type MOS transistor is connected to the power voltage terminal or the ground terminal, and wherein the delay circuit comprises:

a capacitor that is charged or discharged by the current provided by the current source circuit;

a voltage comparator circuit that detects a charged voltage of the capacitor; and a switch that switches, according to an output signal of the voltage comparator circuit, an input to the voltage comparator circuit between a first reference voltage and a second reference voltage which is lower than the first reference voltage.

16. The delay system according to claim 15, wherein:

the first depletion type MOS transistor is an element formed on a semiconductor chip, and the resistance element is constituted by a well region formed simultaneously with a well region constituting a substrate of the first depletion type MOS transistor.

17. The delay system according to claim 15, wherein:

the first depletion type MOS transistor is an element formed on a semiconductor chip, and the resistance element is constituted by an active region formed simultaneously with active regions constituting a source region and a drain region of the first depletion type MOS transistor.

18. The delay system according to claim 15, wherein:

the resistance element is constituted by an enhancement type MOS transistor including a gate terminal to which a predetermined voltage is applied.

19. The delay system according to claim 15, wherein:

the first depletion type MOS transistor is of a N-channel type, the gate terminal of the first depletion type MOS transistor is connected to the ground terminal, and the resistance element is connected between the source terminal of the first depletion type MOS transistor and the ground terminal.

20. The delay system according to claim 15, wherein:

the first depletion type MOS transistor is of a P-channel type, the gate terminal of the first depletion type MOS transistor is connected to the power voltage terminal, and the resistance element is connected between the source terminal of the first depletion type MOS transistor and the power voltage terminal.

* * * * *